(12) United States Patent
Bendel et al.

(10) Patent No.: US 6,395,971 B1
(45) Date of Patent: May 28, 2002

(54) APPARATUS FOR CONVERTING SOLAR ENERGY INTO ELECTRICAL ENERGY AND FOR RADIATING AND/OR RECEIVING HIGH FREQUENCY ELECTROMAGNETIC WAVES

(75) Inventors: Christian Bendel, Schauenburg; Norbert Henze, Kassel; Joerg Kirchhof, Habichtswald, all of (DE)

(73) Assignee: Institut Fuer Solare Energieversorgungstechnik (ISET) Verein an der Universitaet Gesamthochschule Kassel e.V. (DE)

( * ) Notice: Subject to any disclaimer, the term of this patent is extended or adjusted under 35 U.S.C. 154(b) by 0 days.

(21) Appl. No.: 09/634,769

(22) Filed: Aug. 9, 2000

(30) Foreign Application Priority Data

Aug. 12, 1999 (DE) .......................... 199 38 199

(51) Int. Cl.[7] .......................... H01L 31/04; H01Q 1/00
(52) U.S. Cl. ...................... 136/244; 136/256; 136/291; 136/293; 343/720; 343/721; 343/728; 343/866; 343/904; 343/906
(58) Field of Search .................. 136/244, 256, 136/291, 293; 343/720, 721, 728, 866, 904, 906

(56) References Cited

U.S. PATENT DOCUMENTS 4,490,668 A * 12/1984 Sterzer .......................... 244/159
5,642,122 A * 6/1997 Lockie et al. ................ 343/881
6,087,991 A * 7/2000 Kustas ................ 343/700 MS

FOREIGN PATENT DOCUMENTS

| FR | 2634224 A1 | * | 1/1990 |
| JP | 8-274527 A | * | 10/1996 |
| JP | 9-135110 A | * | 5/1997 |
| JP | 10-242443 A | * | 9/1998 |
| JP | 10-270925 A | * | 10/1998 |
| WO | WO-97/44707 A2 | * | 11/1997 |

OTHER PUBLICATIONS

Zawadski et al, "Integrated RF antenna and solar array for spacecraft applications," IEEE, pp. 239–242, 2000.*
Vaccaro et al, "Integrated solar panel antennas," Electronics Letters, vol. 36, No. 5, pp. 390–391, Mar. 2, 2000.*
Vaccaro et al, "Stainless steel slot antenna with integrated solar cell," Electronics Letters, vol. 36, No. 25, pp. 2059–2060, Dec. 7, 2000.*
Patent Abstracts of Japan JP 10242443 09/11/98, DEPANET–BIBLIOGRAPHISCHE DATEN.
Patent Abstracts of Japan, Abstract for JP 8–274527 A, 10–1996.
Patent Abstracts of Japan JP 6029734 of 02/04/94, DEPANET –BIBLIOGRAPHISCHE DATEN.
Patent Abstracts of Japan, Abstract for JP 10–270925 A, 10–1998.

* cited by examiner

Primary Examiner—Alan Diamond
(74) Attorney, Agent, or Firm—Michael J. Striker

(57) ABSTRACT

An apparatus (1) for converting solar energy into electrical energy and for radiating and/or receiving high frequency electromagnetic waves is described. The apparatus (1) includes at least one solar cell (2) provided with electrodes in the form of electrically conducting contacts, wherein at least one of the contacts of the solar cell at the same time forms an antenna element.

17 Claims, 9 Drawing Sheets

APPARATUS FOR CONVERTING SOLAR ENERGY INTO ELECTRICAL ENERGY AND FOR RADIATING AND/OR RECEIVING HIGH FREQUENCY ELECTROMAGNETIC WAVES

TECHNICAL FIELD

This invention relates an apparatus for converting solar energy into electrical energy and for transmitting and/or receiving high-frequency electromagnetic waves, comprising at least one solar cell having electrodes in the form of electrically conducting contacts and an antenna provided with at least one antenna element.

BACKGROUND OF THE INVENTION

Known apparatuses of this kind consist of an interconnected assembly, which includes at least one solar cell, an antenna element and an electronic component in the form of a display, an image or sound converter, a signal processing circuit, or the like. The antenna in one variant consists of a metal plate connected to the component, while a plurality of solar cells are arranged like a frame surrounding the component (JP-A 10 242 443). In another variant the antenna is a frame antenna surrounding the component and the solar cell arrangement and being e.g. formed by a conductor arranged on the surface of the component (WO 97/44 707). Such arrangements are used in portable radios, televisions, pocket computers or similar devices, for example.

It is further known, especially in satellite technology, to operate large area antennae with the aid of solar cell modules arranged separately therefrom (U.S. Pat. No. 5,642,122, JP-A-08 274 527). The solar cell modules and antennae are in fact frequently connected physically to one another, but for the rest they are usually used as spatially and functionally separate components. This is true also in cases in which the antennae are in the form of parabolic antennae and have a reflector consisting of a metal grating, behind which a solar cell module is arranged (JP-A 9 135 110), or in which individual solar cells are mounted between antenna elements spaced from one another, in order to form a planar antenna (JP-A 6 029 734). Finally, in apparatuses comprising a plurality of antenna elements, a plurality of solar cells arranged below said elements and a conductive layer arranged between the elements and the cells, the function of the solar cells is restricted, because the cells are partially covered by the antenna elements (JP-A-10 270 925).

The described apparatuses require a comparatively large amount of space, in spite of the combination of solar cells and antenna elements in interconnected assemblies, resulting from the sum of the space requirements of the individual components. Apart from this the solar cells are at least partially covered by antenna elements, which affects their function when they are needed to provide the most cost-effective generation of current in efficient photo-voltaic units for example.

SUMMARY OF THE INVENTION

The invention is, therefore, based on the object to design the apparatus of the kind specified above such that it is suitable in particular for use in photo-voltaic devices.

A further object of this invention is to give the apparatus a space-saving design.

Yet another object of this invention is to combine parts of the solar elements and the antennae in order to obtain in a simple construction an integrated assembly.

These and other objects are solved in accordance with this invention by means of an apparatus of the kind specified above and being characterized in that said antenna element is formed by at least one of said contacts of the solar cell.

The apparatus according to the invention provides the advantage that solar cells and antennae are not merely combined in an integrated assembly but that electrically conductive contacts, which are in any case present in a solar cell or solar cell arrangement to allow them to operate are used as antenna elements at the same time. The additional fitting of antenna elements can thus be completely avoided.

Further advantageous features of the invention appear from the dependent claims.

BRIEF DESCRIPTION OF THE DRAWINGS

The invention will be explained in more detail below in conjunction with the accompanying drawings of embodiments, in which.

DETAILED DESCRIPTION OF THE PREFERRED EMBODIMENTS

Figure 1:
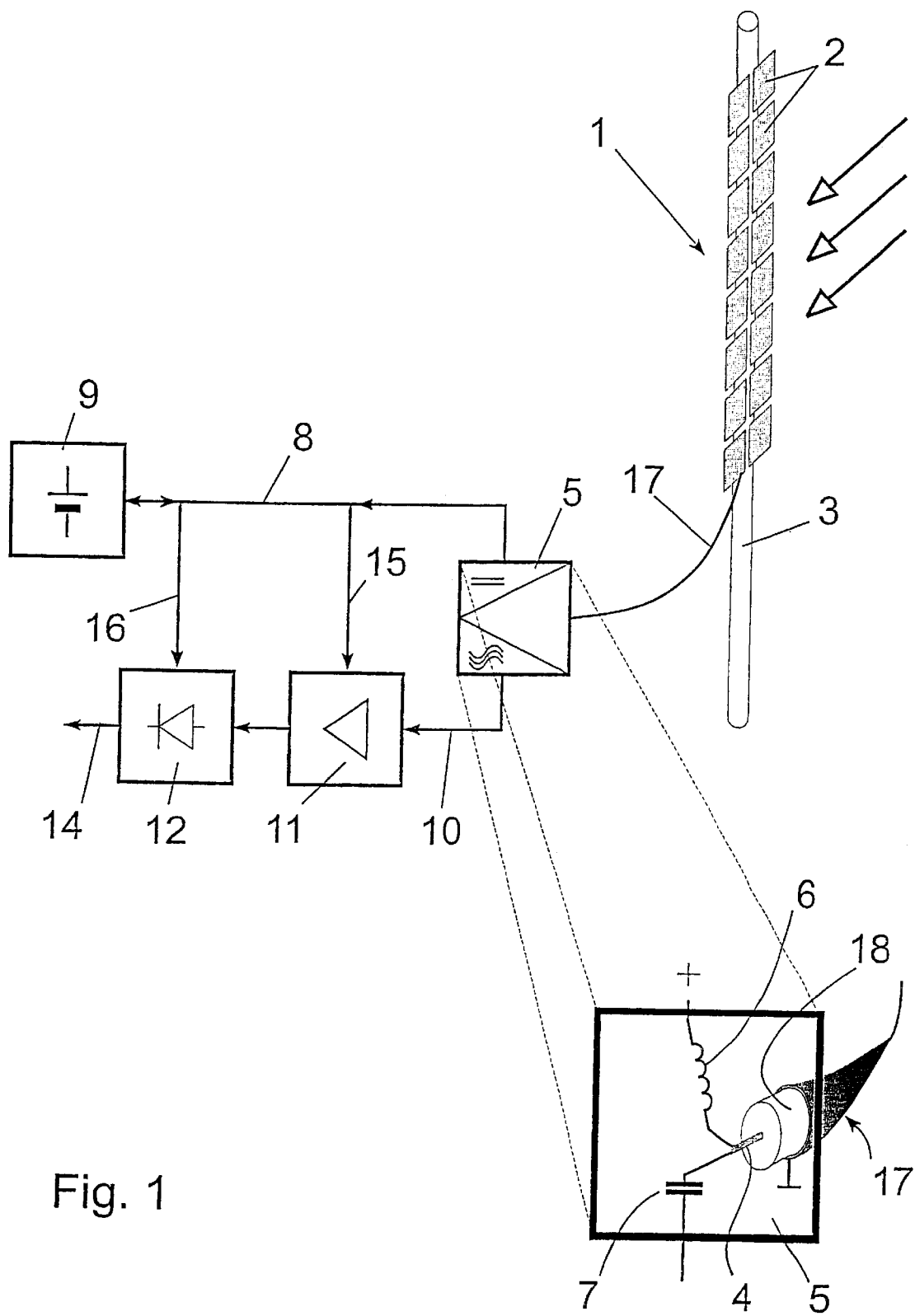
FIG. 1 shows an apparatus according to the invention schematically, provided with a plurality of solar cells, for converting solar energy into electrical energy and for receiving high frequency electromagnetic waves.

FIG. 1 shows an apparatus 1 with a plurality, here sixteen, solar cells 2, which form one module or array of an actual operating photo-voltaic installation for example, are mounted on a suitable support 3 and serve to convert the incident solar energy into electrical energy. The solar cells 2 are made in accordance with any currently used technique and consist of a substantially plane-parallel plate for example, which is rectangular or square in plan and has a thickness of a few millimeters. Moreover each solar cell 2 preferably consists of a semiconductor body, e.g. a crystalline silicon substrate, which has a normal contact grating on its upper side and a conductive contact layer on its underside covering the whole area, mostly consisting of metal. The various solar cells 2 are moreover connected in series and/or parallel in relation to direct current, in known manner by electric lines and are provided with normal covering layers of glass or plastics material if required.

The apparatus 1 is used according to the invention at the same time for radiating and/or receiving high frequency electromagnetic waves. To this end at least one contact of at least one solar cell 2 is used at the same time as an antenna element, e.g. as an element of a planar antenna. This leads to the advantage that an electric contact present in the solar cell 2 can be used for a second function so that additional components are avoided.

The case is shown in FIG. 1 in which the antenna is used as a receiving antenna. Accordingly the solar cell module is used on the one hand when there is incident solar energy to convert this into electrical energy and on the other hand when there are incident electromagnetic waves to receive these and pass them on through electric lines.

In order to meet the two different objectives, according to FIG. 1 the positive contact for example of the solar cell module is connected by means of an electric line 17 to a branching filter 5, which serves to separate the direct current component obtained from the conversion of the solar energy from the high frequency current component obtained from the irradiation by HF waves. This is effected as indicated in FIG. 1, bottom right, by an enlarged view of the branching filter 5, by a branching, comprising an inductance 6, e.g. in the form of a coil, for passing the direct current component and blocking the high frequency component and a capacitance 7, e.g. in the form of a capacitor, for passing the alternating current component and blocking the direct current component. The inductance 6 is further connected to a battery 9 for example, by means of an electric line 8, in order to charge it, or keep it charged, when irradiated by the sun, while the capacitance 7 is connected through an electric line 10 to a receiver 11 and thence to a demodulator 12, at whose output 14 data or signals for further processing are derived. Moreover the line 8 can be connected by further lines 15, 16 to the terminals of the receiver 11 and of the demodulator 12 serving for current supply, so that these can be supplied selectively directly from solar power or with the aid of the battery 9. As FIG. 1 further shows, the line 4 is advantageously the inner conductor of a coaxial cable 17, whose outer braid 18 is connected to ground, together with the negative contact of the solar cell module.

Figure 2:
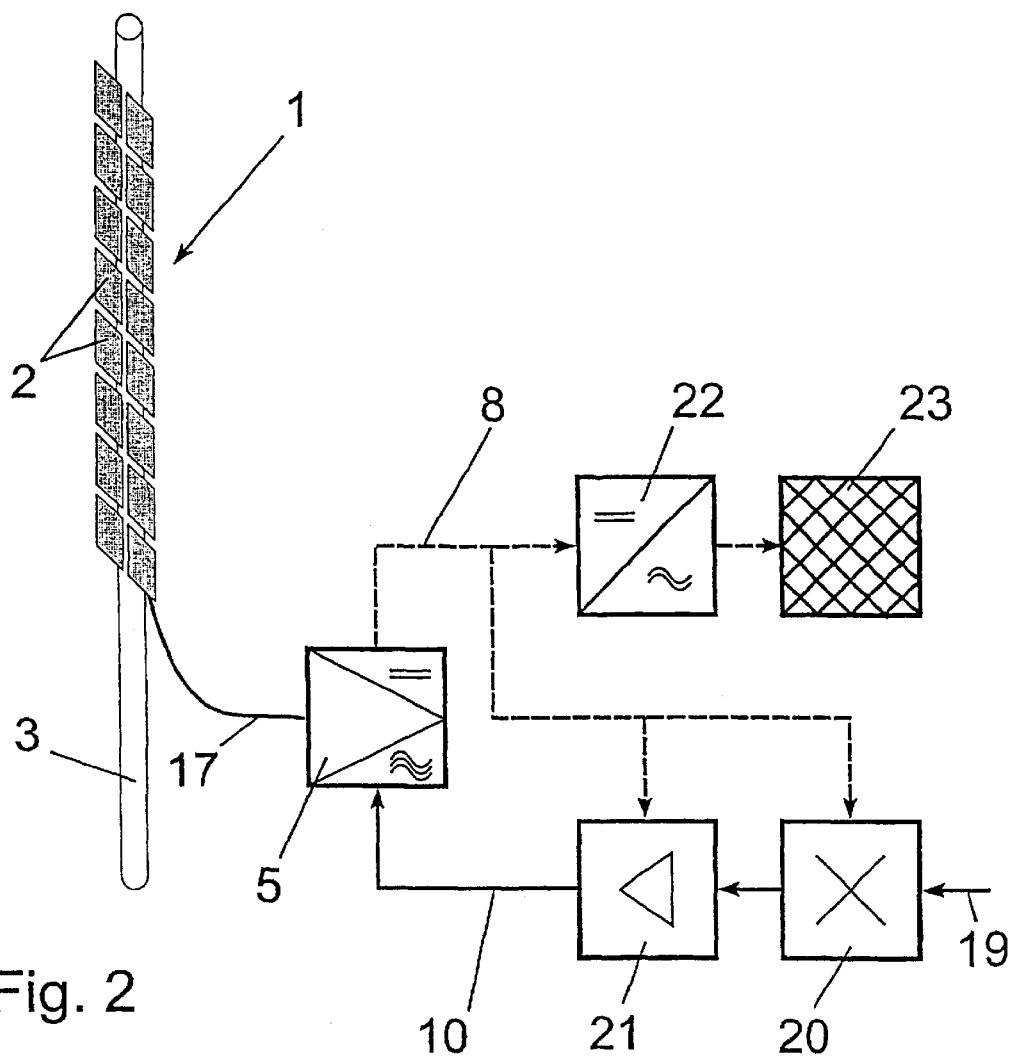
FIG. 2 shows a second embodiment of the apparatus according to FIG. 1 schematically, but for transmitting high frequency electromagnetic waves.

If it is desired to use at least one contact of a solar cell 2 as a transmitting antenna, the procedure is as in FIG. 2 for example. In contrast to FIG. 1, signals are fed to a modulator 20 over a line 19 and thence to a transmitter 21, from which they are passed to the at least one contact of the at least one solar cell 2 through the line 10, the branching filter 5 and the line 17 and are radiated into space from the contact in the form of electromagnetic waves. FIG. 2 moreover shows schematically that the direct current derived over the line 8 is fed selectively also to an inverter 22, is converted thereby into an alternating current and can then be fed into an electric supply network 23. The apparatuses according to FIGS. 1 and 2 can also be combined with one another, in that the parts 11, 12 on the one hand and 20, 21 on the other hand are connected to the line 10 through a switch for example, in order to be able to transmit or receive, depending on the switch setting.

It is moreover clear that the direct currents or direct voltages obtained from the solar energy are completely decoupled from high frequency electromagnetic waves, because of the branching filter 5 and that the direct and alternating current components can each be treated or processed in a way known per se for such. It is also possible to tune the contact acting as an antenna element through choice of the size of the radiating or receiving solar cell(s) 2 to match the high frequency desired in a particular case or the HF band to be processed, to use two or more solar cells 2 to produce a dipole or group antenna or to give the antenna a selected directivity by circuit measures.

If for example a coaxial cable is used in FIGS. 1 and 2 with a characteristic impedance of 50 Ω, the branching filter 5 can have an inductance 6 of $1.6 \leq 50 \; \Omega/2 \pi f$ and a capacitance of $\frac{1}{2} \pi f.0,1\Omega \leq c \leq \frac{1}{2}\pi f.50\Omega$.

FIGS. 3 to 9 each show a single solar cell 2 formed in the usual way and different ways of coupling the HF energy.

Figures 3, 4:
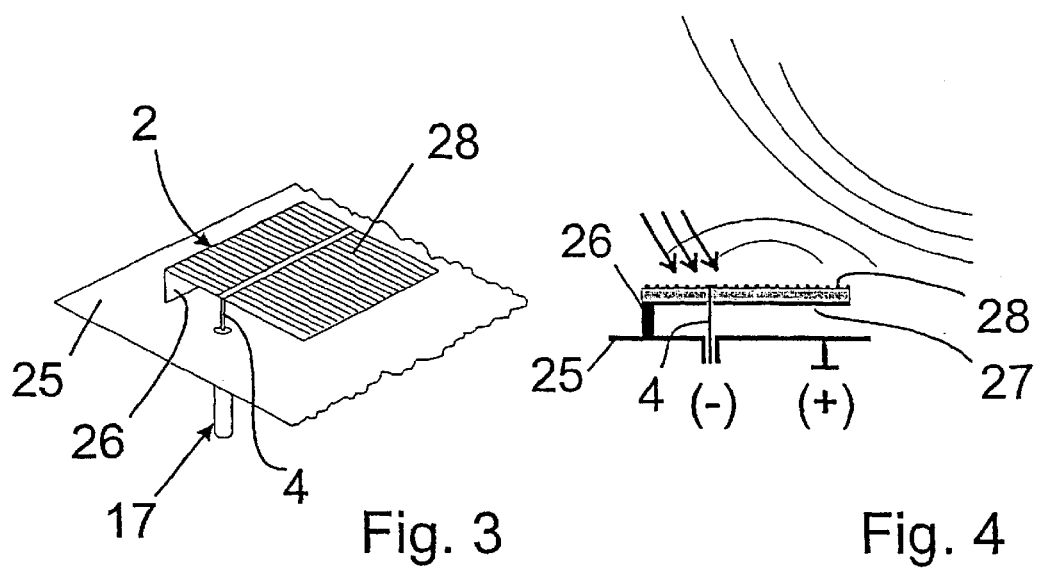
FIG. 3 is a schematic, perspective representation of the coupling in or out of the HF waves when using a single solar cell.
FIG. 4 is a cross-section through the apparatus of FIG. 3.

In FIGS. 3 and 4 there is shown the coupling through the coaxial cable 17 already seen in FIG. 1. A metal plate 25 connected to ground serves as the support for the solar cell 2 and is connected by a web 26 to a contact layer 27 (FIG. 4) forming the positive terminal for example, located on the underside of the solar cell 2. On the other hand a contact grating 28 located on the upper side of the solar cell 2 and forming the negative terminal for example is connected to the inner conductor 4 of the coaxial cable 17 through openings in the contact layer 27 and the metal plate 25, where the inner conductor 4 is connected in accordance with FIGS. 1 and 2 and the outer braid of the coaxial cable 17 is connected to the metal plate 25. The antenna created in this way can be denoted a PIFA (planar inverted F-antenna). Moreover a substrate of an electrically non-conducting material can be arranged between the metal plate 25 and the contact layer 27.

Figure 5:
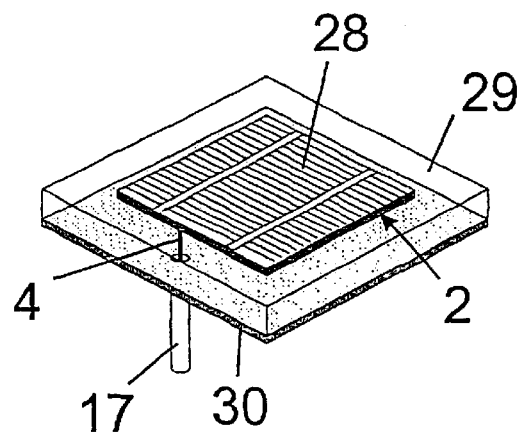
FIGS. 5 to 9 show views corresponding to FIG. 3 and partially exploded views of alternative ways of coupling in or out.

FIG. 5, in which the embodiment of the invention at present regarded as the best, shows a coupling by means of the coaxial cable 17 when using the solar cell 2 as a planar antenna. The solar cell 2 is here fixed on the upper side of a substrate 29 of an electrically insulating material, e.g. by an adhesive, with a grounded metal plate 30 fixed on the underside of the substrate. The upper, e.g. negative contact grating 28 is, in contrast with FIGS. 3 and 4, DC grounded while the inner conductor of the coaxial cable 17 is connected to the lower, e.g. positive contact layer 27 (FIG. 4) of the solar cell 2 through openings in the substrate 29 and in the metal plate 30. In contrast to FIGS. 3 and 4 the connecting short-circuit web 26 is also simply omitted, so that different resonant frequencies result in respect of the antenna action.

Figure 6:
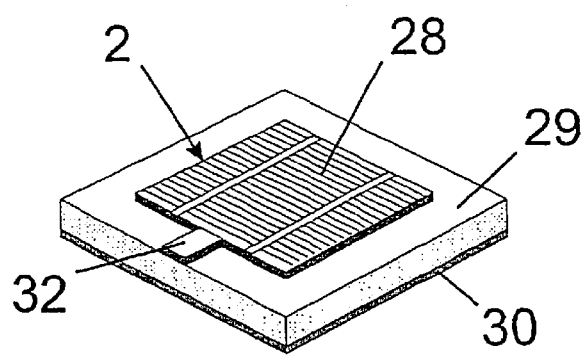

FIG. 6 shows the example of a direct coupling in conjunction with a planar antenna. The HF supply of HF take-off is here effected through a stripline 32 of an electrically conductive material formed on the substrate 29, which is connected by analogy with FIGS. 3 to 5 to the lower, e.g. positive contact layer 27 (FIG. 4) of the solar cell 2 and is connected to the branching filter 5 according to FIGS. 1 and 2. The arrangement is otherwise analogous to FIG. 5.

Figure 7:
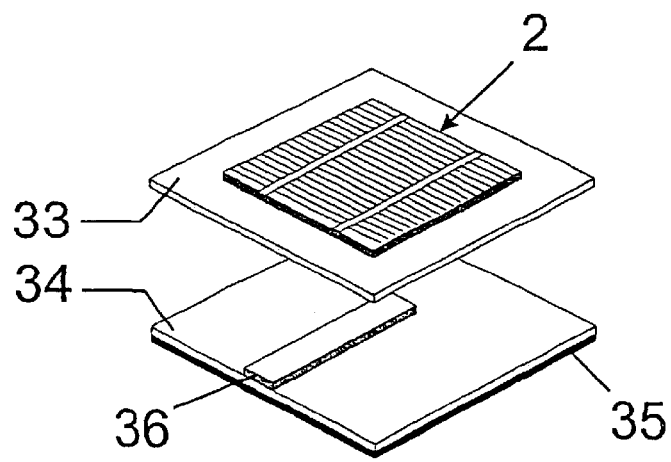

In the arrangement shown in exploded view in FIG. 7, radiative coupling is involved. The solar cell 2 is here fixed by an adhesive for example with its lower contact layer 27 (FIG. 4) on the upper side of a first substrate 33 of an electrically insulating material, the underside of which is connected to the upper side of a second electrically insulating substrate 34, on the underside of which a metal plate 35 serving as ground is fixed, e.g. by an adhesive. A stripline 36 of an electrically conductive material is fixed between the two substrates 33 and 34, through which the HF coupling in or out is effected and which is analogy with the other views connected to the branching filter 5 but which can equally be connected directly to a transmitter or receiver. The width of the stripline 36 is substantially less than the width of the associated contact layer 27 (FIG. 4) of the solar cell 2 lying thereover and serving as the antenna element.

Figure 8:
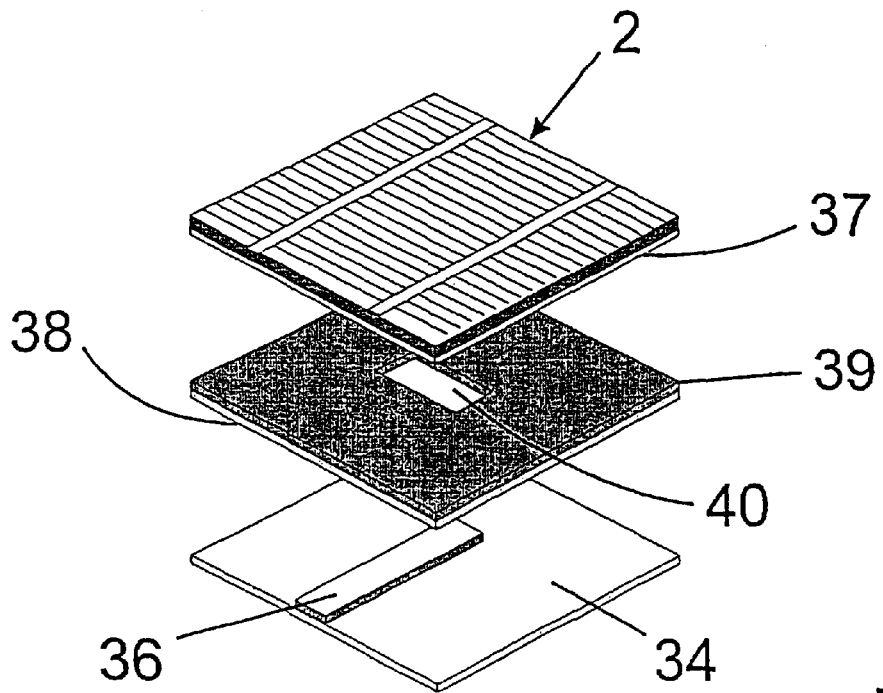

An exploded view of a slot coupling is shown in FIG. 8. The solar cell 2 has its contact layer 27 (FIG. 4) fixed on the upper side of an electrically non-conductive substrate 37. A substrate 34 formed like in FIG. 7 with an electrically conductive stripline 36 is arranged below the substrate 37. A third substrate 38 of an electrically insulating material is arranged between the two substrates 34, 37, with a metal plate 39 having a slot 40 fixed on its upper side facing the substrate 37. The three, preferably plate-like substrates 35, 37 and 38 are stacked in the way seen in FIG. 8 and fixed together, with the stripline 36 between the substrates 34 and 38 and the metal plate 39 between the substrates 38 and 37. The stripline 36 is on the one hand so disposed on the substrate 35 that it lies under the slot 40 in the finished product and is on the other hand connected to the branching filter 5 according to FIGS. 1 and 2 or directly to a transmitter or a receiver.

If a solar cell 2 with a size of 10 cm. 10 cm is used in FIG. 8 for example in conjunction with a substrate 37 having a relative dielectric constant of Er=2.5, the described antenna is suitable for use at a frequency of f=900 MHz.

Figure 9:
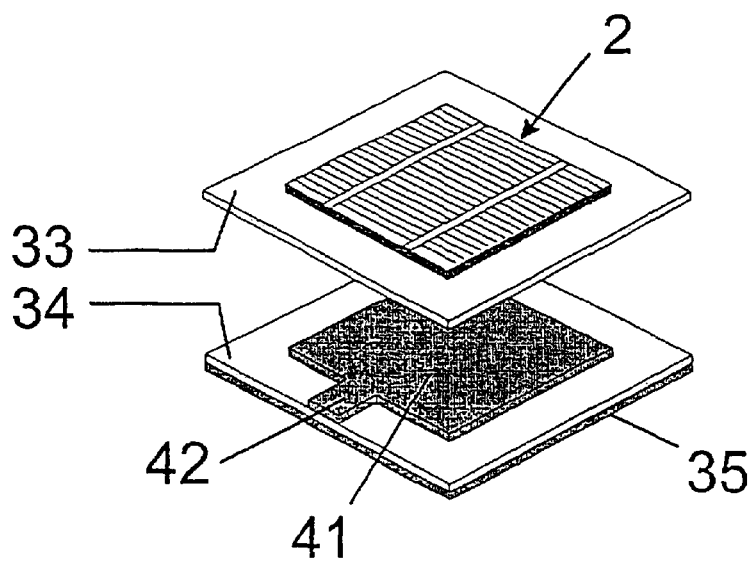

Finally FIG. 9 shows a capacitive coupling, also in an exploded view. The arrangement is similar to FIG. 7, with the sole difference that the narrow stripline 36 (FIG. 7) is replaced by a metal plate 41, whose size corresponds substantially to the size of the contact layer 27 (FIG. 4) of the solar cell 2 and which forms together with this contact layer 27 two coupled resonators (i.e. a capacitor). The excitation or extraction of the high frequency is effected through a terminal 42 of the metal plate 41, which is fed to the branching filter 5 or directly to a transmitter or receiver. The contact layer 27 of the solar cell 2 is here coupled capacitively to the metal plate 41.

In the arrangement according to FIG. 9 the solar cell 2 forms a planar antenna, as in the arrangements according to FIGS. 5 to 8, where the upper contact grating forms a negative terminal for example and the lower contact layer a positive terminal. The branching filter 5 is not necessary, as in the arrangements according to FIGS. 7 and 8, since there is no direct connection to the contact layer of the solar cell 2 acting as an antenna element. It is however advantageous to decouple the solar cell 2 from the high frequency current by an inductor or the like, in order to avoid the current passing to a load.

Figure 10:
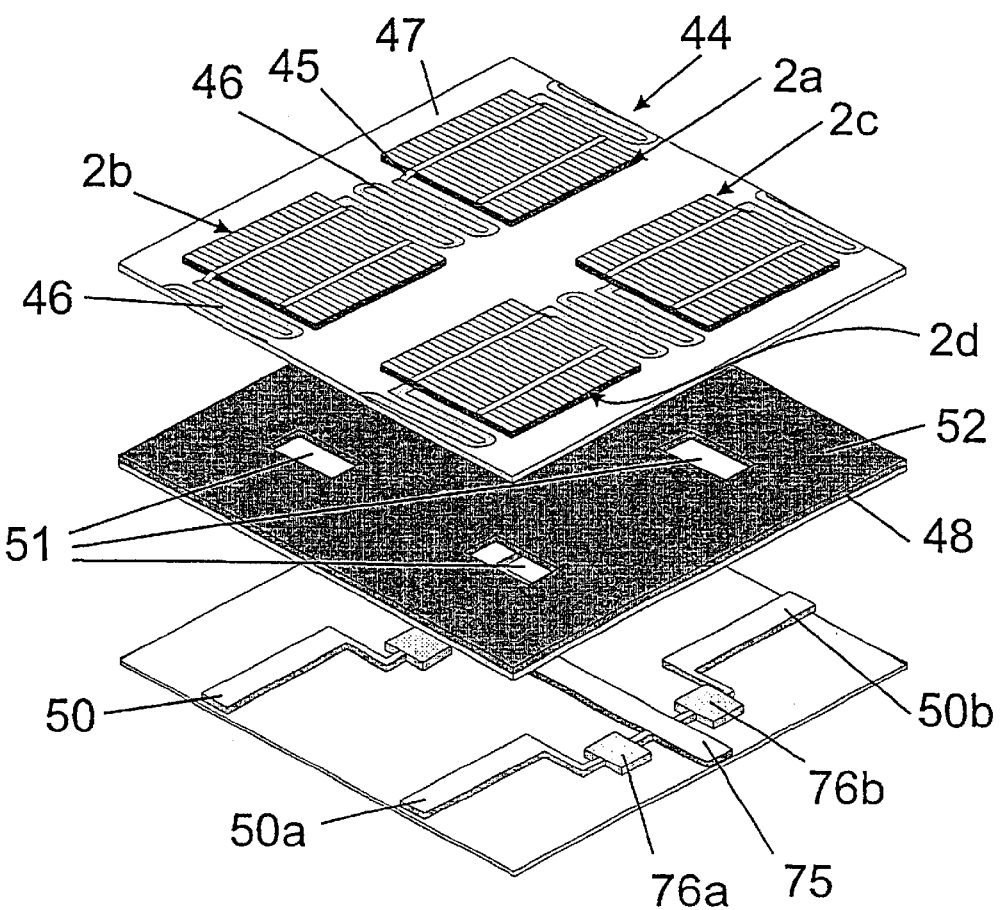
FIG. 10 is a perspective and exploded view of an apparatus according to FIG. 1 with four solar cells connected in pairs in rows.

FIG. 10 shows a portion of an apparatus 44 in the form of a solar cell module, where this portion includes 4 solar cells 2a to 2d formed according to FIGS. 1 to 9 for example and the solar cells 2a, 2b and 2c, 2d are connected together in pairs in rows with respect to DC. The two series circuits can moreover be connected selectively in parallel and/or likewise in series, which is not shown. The individual solar cells 2a to 2d are decoupled from one another with respect to high frequency alternating current. This is achieved according to FIG. 11 for example in that the contact grating 28c of a first solar cell 2c is connected in series with the contact layer 27d of a solar cell 2d following in series connection by a line 45 and in that an inductance 46 is connected in this line 45, as is indicated in FIG. 10, by designing line 45 in the manner of a loop or winding for example. The value of the inductance 46 is so selected that it blocks the passage of high frequency alternating current. The design of the inductances 46 can also be effected in a different way.

Figure 11:
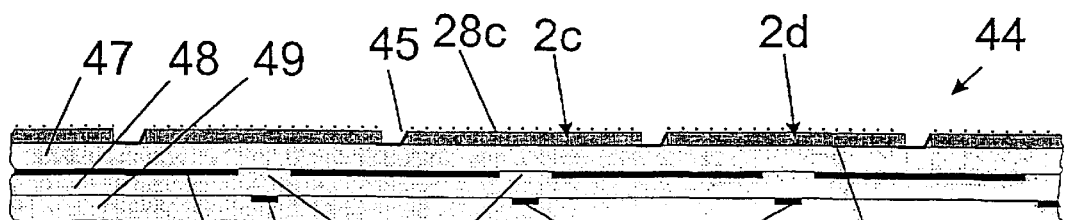
FIGS. 11 and 12 show cross-sections through two alternative embodiments of the apparatus according to FIG. 10.

The solar cells 2a to 2d are moreover coupled with respect to high frequency alternating fields like in FIG. 8, by slot coupling for example. All solar cells 2a to 2d are fixed for this with their contact layers(e.g. 27d) on a common, plate-formed substrate 47, which is connected into a fixed assembly with two further, plate formed substrates 48 and 49. Gaps remain free in between the individual solar cells 2a to 2d. By analogy with FIG. 8 a stripline arrangement 50 is disposed between the substrates 49 and 48, corresponding to the stripline 36, for coupling high frequency alternating current in and out and a metal plate 52 provided with slots 51 is arranged between the substrates 48 and 47, where a slot 51 is associated with each lower contact layer (e.g. 27d in FIG. 11) of the solar cells 2a to 2d, each slot lying approximately in the middle of the corresponding contact layer, so that free gaps left between the solar cells 2a to 2d are each bridged over by the metal plate 52, as FIG. 11 shows. By selecting the piston and size of the slots 51 the antenna function can be optimized as in the case of FIG. 8.

The lines 45 are advantageously produced in that they are formed on the upper surface of the substrate 47 by methods customary in semiconductor technology, are connected to the contact layers (e.g. 27d) and are then connected to the associated contact gratings (e.g. 28c) by contacts running perpendicular thereto. Thus the complete apparatus 44 seen in FIGS. 10 and 11 can be produced using the usual multilayer, coating technology for printed circuit fabrication, in a cost-effective manner.

Figure 12:
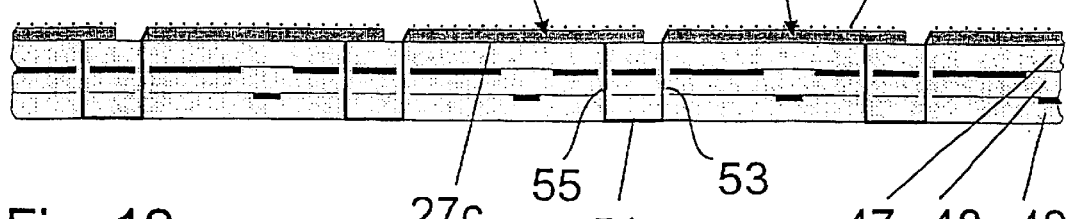

The alternative according to FIG. 12, in which the like parts are given the same reference numerals, differs from that according to FIG. 11 only in that the contact gratings (e.g. 28c) of the solar cells (e.g. 2c) are connected with the beginnings of lines (e.g. 54) formed on the rear side of the substrate 49 with the aid of contacts 53 passing through the substrates 47, 48 and 49 as well as openings in the metal plate 52. These lines 54 can be designed like loops analogous to the lines 45 and their ends connected with the aid of further through contacts 55 to the contact layer (e.g. 27d in FIG. 12) of the respective next solar cell (e.g. 2d). Such an arrangement is especially advantageous when the gaps between the solar cells 2a to 2d are too small for loop formation in the lines 45 (FIGS. 10, 11).

Figure 13:
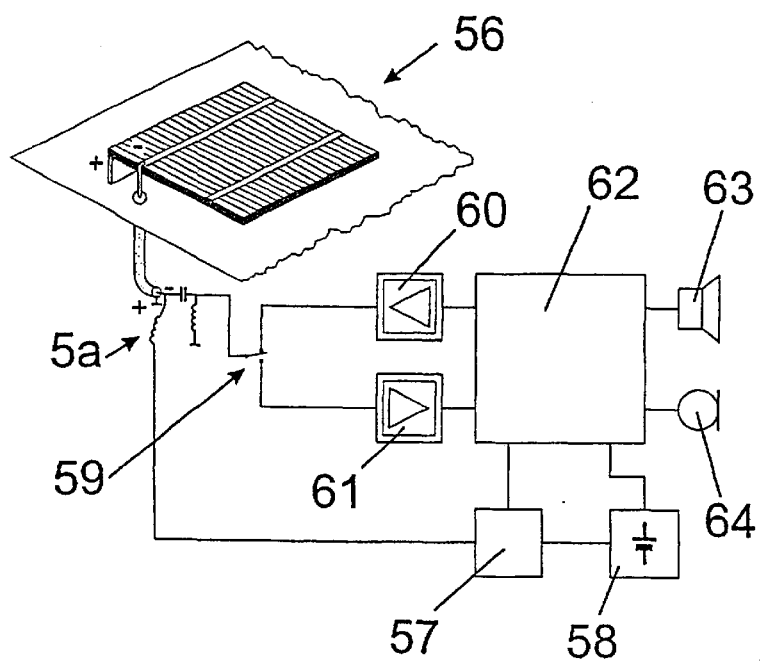
FIGS. 13 and 14 show two examples of applications for the apparatus according to FIG. 1.

FIG. 13 shows an example of an application of an apparatus 56 according to the invention consisting of at least one solar cell 2 with an integrated antenna, which apparatus 56 is formed like in FIGS. 3 and 4 and is fitted in a mobile radio telephone. The direct current terminal is connected by means of a branching filter 5a corresponding to the branching filter 5 of FIGS. 1 and 2 to a charging device 57 for a battery 58 and the high frequency current terminal is connected to a changeover switch 59. This is connected on the one hand to a transmitter section 60 and on the other hand to a receiver section 61. Moreover there is a control block 62 which serves for signal processing and power management and is thus connected via corresponding terminals to a loudspeaker 63 and microphone 64 and to the charging device 57 and the battery 58. By actuating the changeover switch 59 a switch can be made selectively between listening and speaking or receiving and transmitting.

Figure 14:
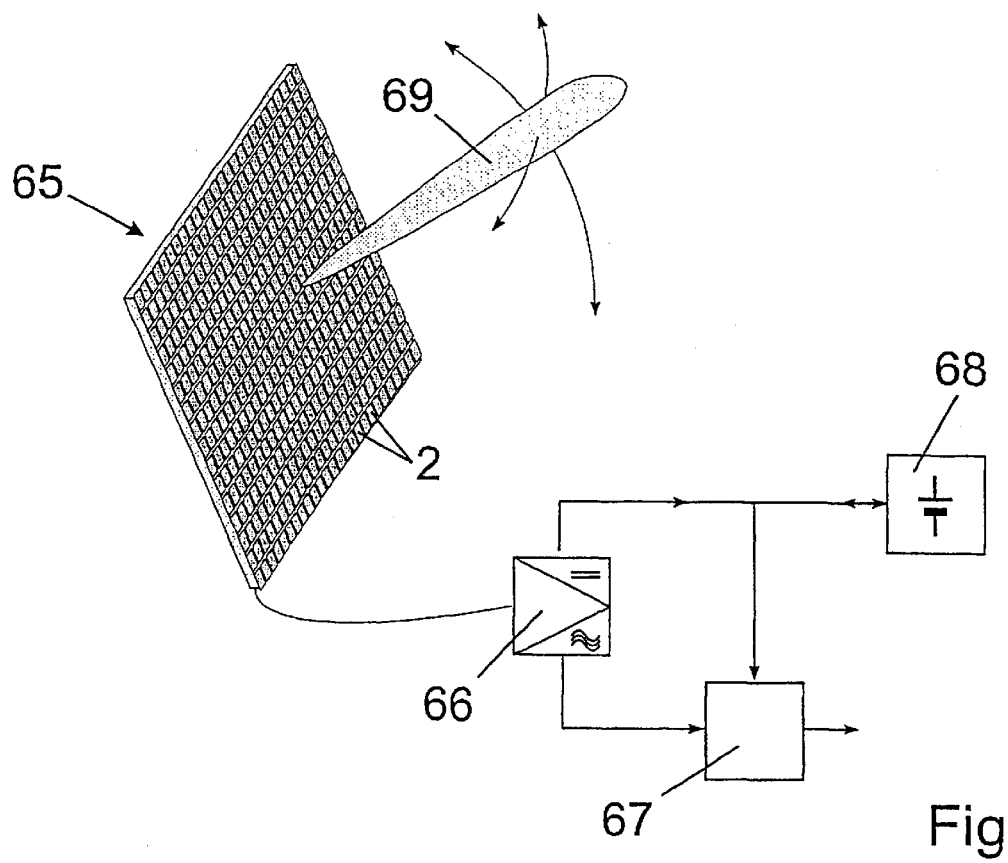

FIG. 14 concerns an embodiment which comprises an apparatus 65 according to the invention with a plurality of solar cells 2 connected in parallel and/or series, whose contacts are used simultaneously as antenna elements. The apparatus 65 therefore at the same time forms a group antenna. The antenna coupling is effected like in FIG. 1 for example with a coaxial cable and a branching filter 66 corresponding to the branching filter 5. The planar antenna formed by the solar cells 2 here serves for satellite reception, so that the HF signals are fed to a satellite receiver 67. The current serving to provided electric power is fed to a battery 68 or for direct use to the satellite receiver 67. A normal antenna lobe is moreover indicated by the reference numeral 69. Its principle axis, which is indicated in FIG. 15 by an arrow 70, is determined by the position of an associated satellite transmitter and for example forms an angle α different from 90° with the substantially flat surface of the solar cells 2.

Figure 15:
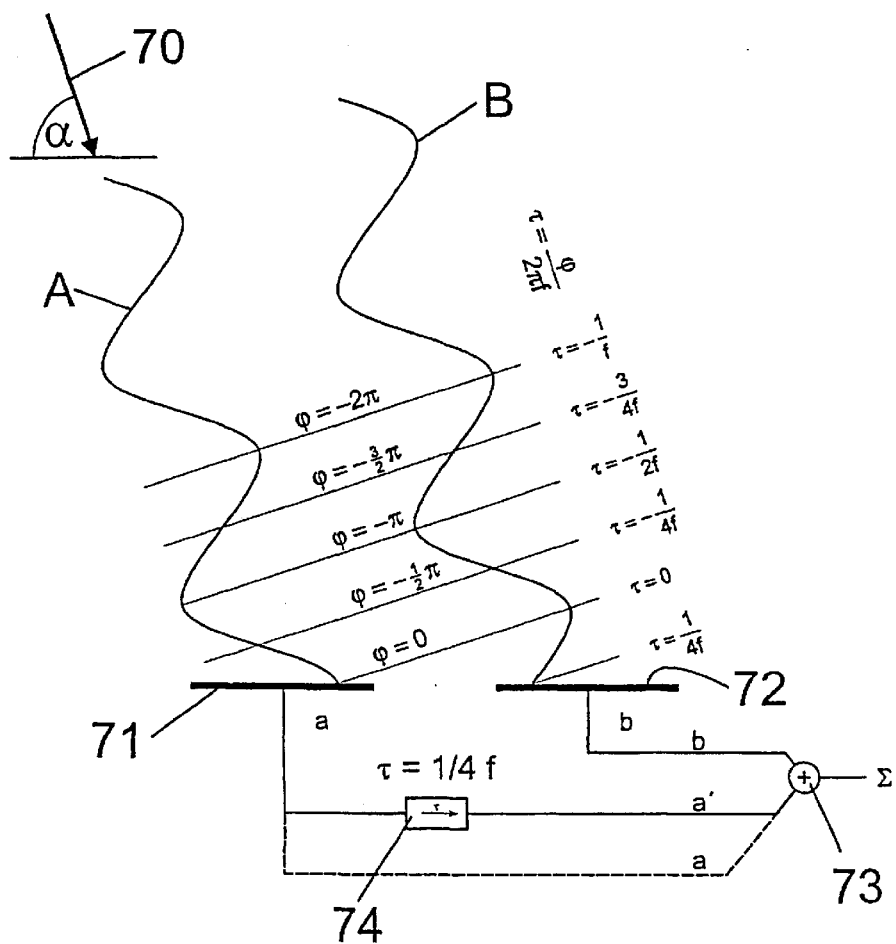
FIG. 15 shows the directivity of the apparatus according to FIG. 14 schematically.
Figure 16:
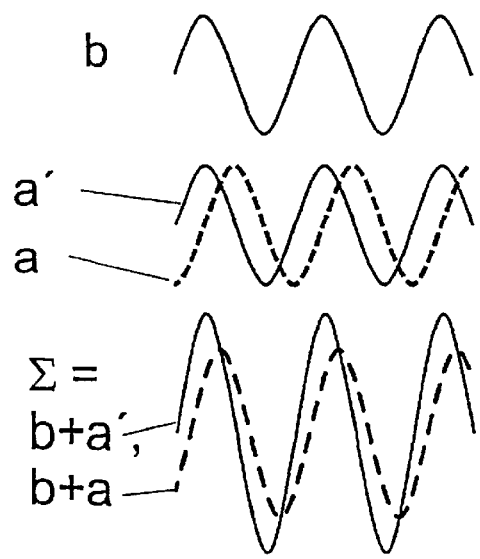
FIG. 16 shows some waveforms of HF waves for explaining the directivity of the apparatus according to FIG. 14.

Two antenna elements 71, 72 of the group antenna according to FIG. 14 are further shown in FIG. 15 and are formed by the lower contact layers 27 (FIG. 4) of two adjacent solar cells and receive HF signals a and b respectively. On account of the oblique incidence of the HF radiation indicated by waves A and B, the wave A reaches the antenna element 71 earlier, i.e. before the wave B reaches the antenna element 72. In the embodiment the phase difference amounts to $\gamma = -\frac{1}{2}\pi$, from which a delay time of $\tau = \frac{1}{4}f$ results. This is indicated in FIG. 16 by the HF signals a (broken line) and b (full line). If therefore the signals a and b were to be added in the usual way in an adder stage 73, the signal $\Sigma = b+a$ shown in broken lines would result, which is not optimal, on account of the phase displacement. If however the signal a is delayed in a delay stage 74 relative to the signal b by the amount $\tau = \frac{1}{4}f$, forming a signal a', both have the same phase at the inputs of the addition stage 73, so that the sum signal $\Sigma = b+a'$ has an optimum amplitude. If the radiation is incident at an angle differing from the angle α according to FIG. 15, the delay stage 74 must be adjusted to a different delay time for optimum matching of the sum signal Σ. This applies correspondingly to all the antenna elements formed by the solar cells 2 of the apparatus 65 according to the FIG. 14.

In the case in which the apparatus 65 is to be used as a transmitting antenna and/or a receiving antenna, it is possible to give the principal axis of the antenna lobe 69 a desired direction by suitable time delay of the HF signals fed to the individual antenna elements. To this end a delay stage 76a, 76b can be connected in each case, as is indicated in FIG. 10, between a common HF feed 75 of the strip arrangement 50 and the strip sections 50a, b, etc., associated with the slots 51. The direction of the antenna lobe 69 can be changed as required by altering the delay times, as is indicated in FIG. 14 by arrows, so that a beam scanning group antenna is obtained. The means needed for this are generally known in antenna technology and therefore do not need to be explained in detail.

Figure 17:
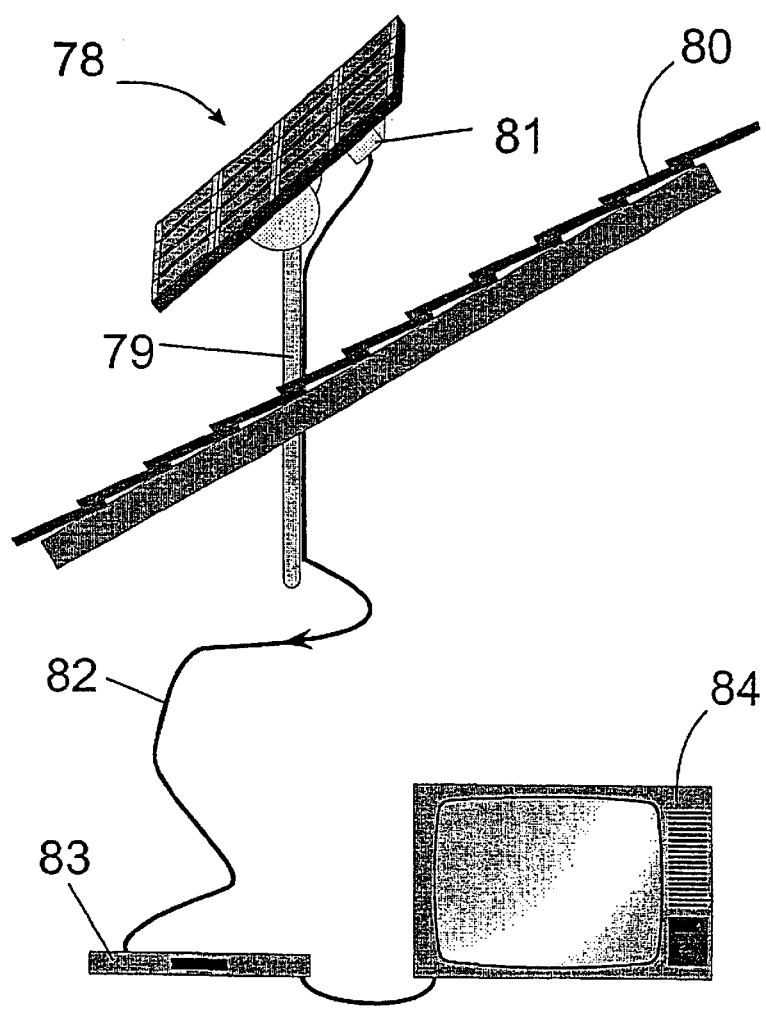
FIGS. 17 and 18 show two further examples of applications for the apparatus according to FIG. 1.

FIG. 17 shows schematically the use of an apparatus 78 corresponding substantially to the apparatus according to FIG. 1, for satellite reception, being mounted by means of an antenna mast 79 of a roof 80 of a house. The HF signals received by the apparatus 78 are coupled out by a branching filter 81 corresponding to the branching filter 5 and fed to a satellite receiver 83 over a coaxial cable 82. They then pass in known manner to a television set 84. The electrical energy obtained from solar radiation can be handled as in usual domestic solar power units.

Figure 18:
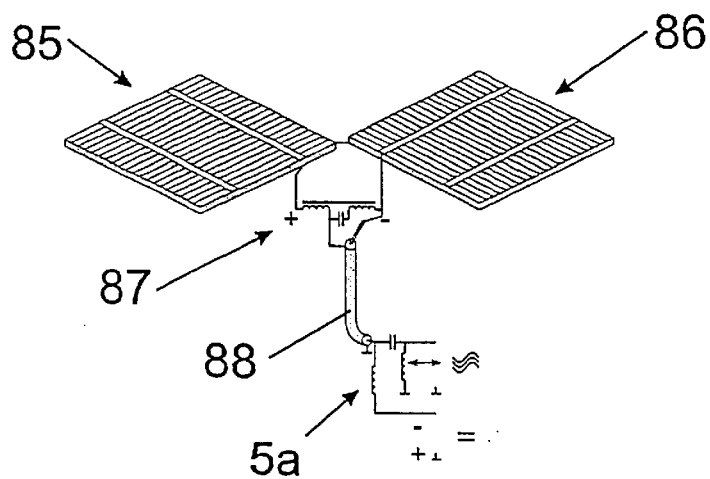

FIG. 18 shows the use of two apparatuses 85, 86 corresponding substantially to the apparatus 1 according to FIG. 1 to form a dipole antenna. For example, the contact grating of the one apparatus 85 is connected to the lower contact layer of the other apparatus 86. Moreover the lower contact layer of the one apparatus 84 is connected to the braid of a coaxial cable 88, for example through the one input of a conventional balancing or balun transformer 87, while the contact grating of the other apparatus 86 is connected to the other input of the balancing transformer 87 and the inner conductor of the coaxial cable 88, through which the separation of the direct and alternating current components is effected by means of the branching filter 5a like in FIG. 13.

Figure 19:
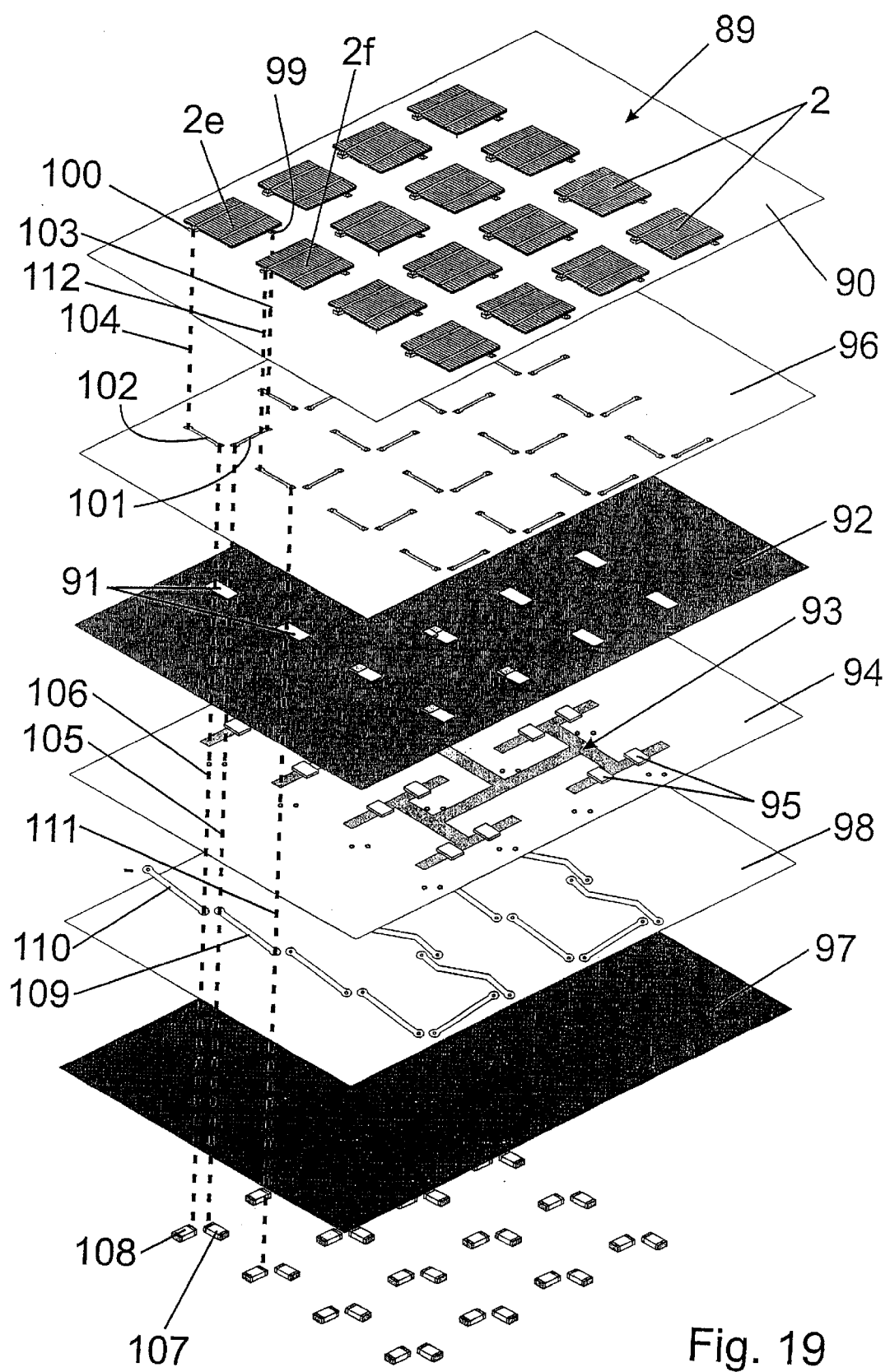
FIG. 19 shows a view corresponding to FIG. 10 of a planar antenna with another kind of decoupling of DC and high frequency current components.

Finally, FIG. 19 shows highly schematically a portion of an apparatus 89 similar to FIG. 10, in the form of a solar cell module, where this portion includes sixteen solar cells 2 for example formed according to FIGS. 1 to 9. The apparatus 89 is particularly well suited to the use of multi-layer techniques, as are used generally in printed circuit technology. Such techniques are characterized by the sequential coating of numerous insulating or conducting zones, as well the application of through contacts.

The apparatus 89 comprises a substrate 90 of insulating material carrying the solar cells 2 in an arrangement and design like that of FIG. 10, a metal plate 92 provided with slots 91 and a further insulating substrate 94 provided with a stripline arrangement 93, where the stripline arrangement 93 can also be provided with the delay stages 95 corresponding to the delay stages 76 (FIG. 10) and a terminal for coupling HF waves in or out. In contrast to FIG. 10, a further sheet form substrate 96 of insulating material is provided between the substrate 90 and the metal plate 92, and below the substrate 94 there is a metal plate 97 used as a ground plane, while a further substrate 98 of insulating material is provided between this and the substrate 94. It will be understood that the metal plates 92 and 97 can also consist of metal layers deposited on the corresponding substrates 96 and 98 with the aid of the multilayer technique.

The solar cells 2 each comprise an electric terminal 99 lying on the substrate 90 and connected to the corresponding lower contact layer and an electric terminal 100, likewise lying on the substrate 90 and connected to the corresponding upper contact grating, as is indicated in FIG. 19 for a solar cell 2e.

A plurality of conductive λ/4 lines, e.g. 101 and 102, serving for the HF decoupling, is disposed on the substrate 96, each of which is associated with a terminal 99 or 100 respectively of a corresponding solar cell (e.g. 2e). The one end of a λ/4 line 101 or 102 is in each case connected to one of the terminals 99 and 100 by a line 103 or 104 respectively, while the respective other end of the λ/4 line is in each case connected via a further line 105, 106 to one plate of a capacitor 107, 108 implemented in SMD technology for example, the other plates of which are grounded via the metal plate 97 for example.

Finally further lines 109, 110 are disposed on the substrate 98 and serve to connect the solar cells 2 of the apparatus in series and/or parallel in relation to direct current. To this end the line 105 for example is connected at a point lying between the associated λ/4 line 101 and the associated capacitor 107 to one end of the line 109, the other end of which is connected to a line 111, which is part of a circuit connected to the contact grating of an adjacent solar cell (e.g. 2f) through a line 112, likewise comprising a λ/4 line and a capacitor. The solar cells 2e and 2f are thus connected in series in relation to direct current. Corresponding connections for series or parallel circuits are provided for all of the other solar cells 2 of the apparatus 89. The circuits consisting of the lines 103 and 105 or 104 and 106, the λ/4 lines 101 or 102 and the capacitors 107 or 108 form in relation to high frequencies a resonant circuit tuned to the frequency of the HF waves to be transmitted, while the circuits formed from the lines 103 and 105 or 104 and 106, the λ/4 lines 101 or 102 and the lines 109 or 110 provide direct connections in relation to direct current between the individual solar cells 2, which are decoupled from the HF waves by the associated resonant circuits or the λ/4 lines 101, 102. It is clear that the lines 101, 102, 109, 110 are preferably formed on the substrates 96, 98, e.g. consisting of metal layers of copper, and the lines 103 to 106 and 111, 112 consist of through contacts, which are fed through the metal plates 92, 97 insulated therefrom.

According to a further embodiment of the invention, not shown in detail, means are associated with each of the apparatuses 1, 44, 65, 78, 89 through which it is possible to thaw out again antenna elements which are iced up by the effect of cold and are therefore no longer fully functional. On account of the combination of solar cells and antenna elements according to the invention it is merely necessary for this to allow such a high current to flow through the solar cells when necessary for these to warm up sufficiently. For example a threefold short circuit current can be used for short--term thawing out, a single short circuit current for slow thawing out, where the short circuit current is the short circuit current of the solar cells or of the whole module arising with full solar irradiation. The required direct current for this purpose can be derived from the battery 9 (FIG. 1) for example and be fed through the solar cells in the direction opposite to the usual current flow.

The invention is not limited to the described embodiments, which can be modified in many ways. This applies in particular to the described kinds of coupling, which can be replaced by other kinds of coupling. Furthermore those contacts of the solar cells which are to be used in accordance with the invention are only to be taken as an example, while the contact gratings in particular can in each case lie underneath and the contact layers on top. Moreover the solar cells can consist of other than crystalline semiconductor wafers, e.g. thin layer or thin film cells or the like. It could further be possible to adapt the apparatuses according to the invention to other antenna forms, especially parabolic antennae suitable for satellite reception for example. To this end the solar cells 2 could be arranged along parabolic surfaces for example and also be made curved or sufficient flexible. It would further be possible the connect all solar cells in the embodiment seen in FIG. 10 for example in parallel instead of in series and thus to connect their contact gratings through inductances to a first line and the contact layers through further inductance to a second line. On account of the decoupling of the direct current components it is immaterial in relation to the antenna function whether the solar cells are connected in parallel and/or series in relation to direct current. Moreover it is largely unimportant to the antenna function whether the contact gratings 28 form the negative terminal and the metal layers 27 the positive terminal in relation to the direct current or vice versa, so that the polarities of these terminals can be chosen in accordance with the requirements of the solar technology. Finally it will be understood that the various features can also be used in combination other than those shown and described.

While the present invention has been described in conjunction with the exemplary embodiment thereof, it will be understood that many modifications will be apparent to those of ordinary skill in the art and the applications intended to cover any adaptions or variations thereof. Therefore it is manifestly intended that the invention be only limited by the claims and equivalents thereof.

What is claimed is:

1. Apparatus for converting solar energy into electrical energy and for transmitting and/or receiving high-frequency electromagnetic waves, comprising: at least one solar cell (2) having electrodes in the form of electrically conducting contacts (27, 28) and an antenna provided with at least one antenna element, said antenna element being formed by at least one of said contacts (27, 28) of the solar cell (2).

2. Apparatus according to claim 1, wherein said at least one contact (27) is arranged to couple in or out an alternating current component formed by the high frequency waves through a coupling selected of a group of couplings at least including radiation, slot or capacitive coupling.

3. Apparatus according to claim 1, wherein a plurality of solar cells (2, 2a to 2f) consist of plate-form components, whose contacts consist in each case of a contact grating (28) disposed on their front side and a contact layer (27) disposed on their back side.

4. Apparatus according to claim 3, wherein said plurality of solar cells (2, 2a to 2f) are assembled in a solar cell module (44, 89) and are separated from one another by gaps.

5. Apparatus according to claim 4, further comprising a plate-form substrate (47, 90) of electrically insulating material, said substrate (47, 90) being provided on an underside with a metal plate (52, 92) bridging over the gaps and having slots (51, 91), and a stripline arrangement (50, 93) of electrically conducting material associated with the slots for coupling in or out the high frequency waves, said plurality of solar cells (2a to 2f) being supported with their contact layer (27) on an upper side of said substrate (47, 90).

6. Apparatus according to claim 5, wherein said metal plate (52) and said stripline arrangement (50) are separated by a further substrate (48) of electrically insulating material.

7. Apparatus according to claim 1 and being produced in multilayer construction.

8. Apparatus according to claim 1 and further comprising lines (101, 102) for decoupling said at least one solar cell (2) from said high-frequency waves and wherein said contacts (27, 28) and said lines (101, 102) are connected by means of through contacting.

9. Apparatus for converting solar energy into electrical energy and for transmitting and/or receiving high-frequency electromagnetic waves, comprising:

at least one solar cell (2) having electrodes in the form of electrically conducting contacts (27, 28); an antenna provided with at least one antenna element, said antenna element being formed by at least one of said contacts (27, 28) of the solar cell (2); and a branching filter (5, 5a, 66, 81) for separating a direct current component generated by the solar cell (2) from an alternating current component formed by the high-frequency waves, said at least one contact (27) being connected to said branching filter (5, 5a, 66, 81).

10. Apparatus for converting solar energy into electrical energy and for transmitting and/or receiving high-frequency electromagnetic waves, comprising:

at least one solar cell (2) having electrodes in the form of electrically conducting contacts (27, 28); an antenna provided with at least one antenna element, said antenna element being formed by at least one of said contacts (27, 28) of the solar cell (2); and a branching filter (5, 5a, 66, 81) for separating a direct current component generated by the solar cell (2) from an alternating current component formed by the high-frequency waves, said at least one contact (27) being connected to said branching filter (5, 5a, 66, 81), wherein said branching filter (5, 5a, 66, 81) comprises an inductance (6) for the direct current component and a capacitance (7) for the high frequency alternating current component.

11. Apparatus for converting solar energy into electrical energy and for transmitting and/or receiving high-frequency electromagnetic waves, comprising:

at least one solar cell (2) having electrodes in the form of electrically conducting contacts (27, 28); an antenna provided with at least one antenna element, said antenna element being formed by at least one of said contacts (27, 28) of the solar cell (2); and a plurality of solar cells (2, 2a to 2f), which have electrically conducting contacts which are connected in series and/or parallel in relation to direct current by electrical lines (45, 109, 110).

12. Apparatus according to claim 11, wherein direct current components of said solar cells (2, 2a to 2f) are decoupled from high frequency alternating current components by inductances (46) provided in said lines (45).

13. Apparatus according to claim 12, wherein said inductances (46) are formed by said lines (45) on a substrate (47).

14. Apparatus according to claim 11, wherein direct current components of said solar cells (2e, 2f) are decoupled from high frequency alternating current components by resonant circuits (101, 107) or (102, 108) associated with said lines (109, 110).

15. Apparatus according to claim 14, wherein said resonant circuits are formed by lines (101, 102) formed on a substrate (96) and by capacitors (107, 108) implemented in SMD technology and wherein said resonant circuits are tuned to a frequency of said high-frequency waves.

16. Apparatus according to claim 11 wherein said contacts (27, 28) and lines (45, 109, 110) are connected by means of through contacting.

17. Apparatus for converting solar energy into electrical energy and for transmitting and/or receiving high-frequency electromagnetic waves, comprising:

at least one solar cell (2) having electrodes in the form of electrically conducting contacts (27, 28), and an antenna provided with at least one antenna element, said antenna element being formed by at least one of said contacts (27, 28) of the solar cell (2), wherein said at least one antenna element has means for deicing the at least one antenna element associated therewith.

* * * * *